(12) United States Patent
Ma (10) Patent No.: US 11,522,033 B2
(45) Date of Patent: Dec. 6, 2022

(54) DISPLAY MODULE AND DISPLAY APPARATUS

(71) Applicant: Wuhan Tianma Micro-Electronics Co., Ltd., Wuhan (CN)

(72) Inventor: Yangzhao Ma, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 197 days.

(21) Appl. No.: 16/871,413

(22) Filed: May 11, 2020

(65) Prior Publication Data
US 2021/0210581 A1    Jul. 8, 2021

(30) Foreign Application Priority Data

Jan. 3, 2020    (CN) .......................... 202010005117.4

(51) Int. Cl.
*H01L 27/32*    (2006.01)
*H01L 27/146*    (2006.01)
*H01L 27/12*    (2006.01)

(52) U.S. Cl.
CPC .... *H01L 27/3276* (2013.01); *H01L 27/14623* (2013.01); *H01L 27/14627* (2013.01); *H01L 27/14636* (2013.01); *H01L 27/3211* (2013.01); *H01L 27/3262* (2013.01); *H01L 27/3265* (2013.01); *H01L 27/3272* (2013.01); *H01L 27/124* (2013.01); *H01L 27/1255* (2013.01)

(58) Field of Classification Search
CPC ........... H01L 27/3276; H01L 27/14623; H01L 27/14627; H01L 27/14636; H01L 27/3211; H01L 27/3262; H01L 27/3265; H01L 27/3272

USPC ........................................................... 257/40
See application file for complete search history.

(56) References Cited

U.S. PATENT DOCUMENTS 10,756,136 B1 *   8/2020  Ma .......................... H01L 31/147
2019/0041709 A1 *  2/2019  Jiang .................. G02F 1/136209
(Continued)

FOREIGN PATENT DOCUMENTS

CN        207338380 U      5/2018
CN        108732801 A      11/2018
(Continued)

OTHER PUBLICATIONS

English Machine Translation of CN 207338380 (Year: 2018).*
(Continued)

*Primary Examiner* — Dzung Tran
(74) *Attorney, Agent, or Firm* — von Briesen & Roper, s.c.

(57) ABSTRACT

Disclosed are a display module and a display apparatus. The display module includes a first display region and a second display region bordering the first display region. The first display region includes first pixel circuit regions arranged in an array and multiple photosensitive regions. The second display region includes second pixel circuit regions arranged in an array. The number of first pixel circuit regions per unit area is equal to and the number of second pixel circuit regions per unit area. The display module further includes an image acquisition module, which includes a micro-lens module. The micro-lens module includes multiple micro-lenses in one-to-one correspondence with the multiple photosensitive regions, and each micro-lens is disposed in a corresponding photosensitive region.

17 Claims, 8 Drawing Sheets

(56) References Cited

U.S. PATENT DOCUMENTS

2019/0325190 A1* 10/2019 Cui .................. G06V 40/13
2020/0203468 A1*  6/2020 Zeng ................ H01L 27/3276
2020/0321409 A1* 10/2020 Zhao ............... G02F 1/134309

FOREIGN PATENT DOCUMENTS

| CN | 106991930 B |  5/2019 |
| CN | 110061014 A |  7/2019 |
| CN | 110189627 A |  8/2019 |
| CN | 110459175 A | 11/2019 |

OTHER PUBLICATIONS

English Machine Translation of CN 110459175 (Year: 2019).*
English Machine Translation of CN 108732801 (Year: 2018).*
Chinese Office Action for related Chinese Application No. 202010005117.4 dated Apr. 6, 2021.

* cited by examiner

DISPLAY MODULE AND DISPLAY APPARATUS

CROSS-REFERENCES TO RELATED APPLICATIONS

This application claims priority to Chinese patent application No. CN 202010005117.4 filed at CNIPA on Jan. 3, 2020, the disclosure of which is incorporated herein by reference in its entirety.

TECHNICAL FIELD

Embodiments of the present disclosure relate to the field of display technologies and, in particular, relate to a display module and a display apparatus.

BACKGROUND

With the development of display technology, full screen has a large screen-to-body ratio and an ultra-narrow border and can greatly improve the visual effect of viewers compared with ordinary display screens, thus attracting extensive attention. At present, in a display apparatus such as a mobile phone that uses the full screen, in order to achieve functions of self-timer, videophone call and fingerprint identification, a front camera, earpiece, fingerprint identification region, physical keys or the like are usually disposed on the front of the display apparatus.

For the common full screen display screen, a non-display region is set within a range surrounded by a display region, and the non-display region is provided with a hole region. For a non-full-screen display screen, modules (e.g., the front camera, a front flash lamp, the earpiece, etc. on the mobile phone) are set in a border region. But, these modules are set in the hole region in the full screen display screen. Apparently, such placing of a camera module in the hole region will influence pixel distribution and wire layout of the display panel, and the hole region will not have the display function, thus the screen-to-body ratio of the display screen is reduced and the display image is incomplete.

SUMMARY

The present disclosure provides a display module and a display apparatus to achieve normal display of an image acquisition region and ensure the integrity of the display image.

In an aspect, an embodiment of the present disclosure provides a display module, and the display module includes a first display region and a second display region bordering the first display region.

The first display region includes a plurality of first pixel circuit regions arranged in an array, the second display region includes a plurality of second pixel circuit regions arranged in an array, and the first display region further includes a plurality of photosensitive regions. The number of first pixel circuit regions per unit area is the same as the number of second pixel circuit regions per unit area.

The display module further includes an image acquisition module, and the image acquisition module includes a micro-lens module. The micro-lens module includes a plurality of micro-lenses which are in one-to-one correspondence with the plurality of photosensitive regions, and each of the plurality of micro-lenses is disposed in a respective one of the plurality of photosensitive regions.

In another aspect, an embodiment of the present disclosure provides a display apparatus, and the display apparatus includes the display module described in the above aspect.

The display module and the display apparatus are provided in the embodiments of the present disclosure. The display module is provided with the first display region and the second display region. The first display region includes the plurality of first pixel circuit regions arranged in the array, and the second display region includes the plurality of second pixel circuit regions arranged in the array. On the basis of ensuring that the number of first pixel circuit regions per unit area is equal to the number of second pixel circuit regions per unit area, the first display region further includes the plurality of photosensitive regions. The display module further includes the image acquisition module, where the image acquisition module includes the micro-lens module, and the plurality of micro-lenses in the micro-lens module are in one-to-one correspondence with the plurality of photosensitive regions with the plurality of photosensitive regions, and each micro-lens is disposed in a respective one of the plurality of photosensitive regions. On the basis that the first display region and the second display region can display normally, the photosensitive regions in the first display region can acquire image elements, and thus, a complete image can be acquired, an image capturing function is achieved, the problem that the hole region of the existing display panel has no display function is solved, the normal display of the image acquisition region is achieved, the integrity of the display image of the display module is ensured, the screen-to-body ratio is increased, and the full screen is achieved.

DETAILED DESCRIPTION

Hereinafter the present disclosure will be further described in detail in conjunction with the drawings and embodiments. It is to be understood that the embodiments set forth herein are merely intended to illustrate and not to limit the present disclosure. Additionally, it is to be noted that for ease of description, merely part, not all, of the structures related to the present disclosure are illustrated in the drawings.

As described in the background section, in order to achieve a front camera function, an upper region of an existing display screen is provided with a hole for disposing the camera module. The hole needs to run through the display panel, and typically, the hole region is partially surrounded by the display region. It is needed to ensure the normal display of the display panel at the edge of the hole region, and therefore, it is necessary to design wires of the edge region of the hole region of the display panel, increasing the difficulty of design and manufacturing of the display panel. On the other hand, an area of display region of the display panel is reduced due to the hole region, and when the display panel displays an image, the integrity of the image will be affect and the display effect of the image is reduced.

In view of the above problems, a display module is provided in an embodiment of the present disclosure and includes a first display region and a second display region bordering the first display region. The first display region includes a plurality of first pixel circuit regions arranged in an array, the second display region includes a plurality of second pixel circuit regions arranged in an array, and the first display region further includes a plurality of photosensitive regions, where the number of first pixel circuit regions per unit area is equal to the number of second pixel circuit regions per unit area. The display module further includes an image acquisition module, where the image acquisition module includes a micro-lens module, the micro-lens module includes a plurality of micro-lenses which are in one-to-one correspondence with the plurality of photosensitive regions, and each of the plurality of micro-lenses is disposed in a respective one of the plurality of photosensitive regions.

The first display region is a display region that can achieve image capturing, and the second display region is a normal display region. Each light-emitting unit in the first display region and the second display region is provided with a pixel driving circuit, accordingly each of the first display region and the second display region includes pixel circuit regions. Difference between a first pixel circuit region of the first display region and a second pixel circuit region of the second display region merely lies in position and area. The pixel driving circuit in the first pixel circuit region and the pixel driving circuit in the second pixel circuit region are the same and are both used for driving the light-emitting unit to emit light. The number of first driving circuit regions per unit area and the number of second driving circuit regions per unit area are the same, that is, the density of the first driving circuit regions and the density of the second driving circuit regions are the same, so that the density of the pixel units corresponding to the first driving circuit regions is the same as the density of the pixel units corresponding to the second driving circuit regions, thereby ensuring the first display region and the second display region to have the same display resolution.

Although the setting density of the first driving circuit region and the setting density of the second driving circuit region are the same, the area of the first driving circuit region and the area of the second driving circuit region may be the same or different. Thus, on the basis of ensuring display requirements of the first display region, the first display region is additionally provided with the plurality of photosensitive regions. The photosensitive regions are regions formed in the first display region for transmitting external light, and the external light can be transmitted via each photosensitive region. The display module is additionally provided with the image acquisition module, where the image acquisition module includes the micro-lens module. The plurality of micro-lenses in the micro-lens module are in one-to-one correspondence with the plurality of photosensitive regions and each of the plurality of micro-lenses is disposed in a respective one of the plurality of photosensitive regions. Each micro-lens can acquire an image element by means of the photosensitive region. In this way, all image elements of an image can be acquired. The image elements are stitched to a complete image. The plurality of photosensitive regions can be arranged in an array or arranged in multiple concentric rings. The arrangement manner of the photosensitive regions can also be designed by those skilled in the art according to the needs of image acquisition, and is not limited in the present disclosure.

It is to be noted that the pixel driving circuit in the display module corresponds to an light-emitting unit, that is, one pixel driving circuit and one light-emitting unit form one sub-pixel unit. Three sub-pixel units corresponding to adjacent three primary color light-emitting units form a pixel unit. In addition, the pixel driving circuit is usually disposed on one side of the light-emitting unit opposite to a light emitting side of the light-emitting unit. Therefore, if a light-transmitting photosensitive region is provided between non-light-transmitting pixel driving circuit regions, it is necessary to reasonably set the shape and size of the light-emitting unit in the first display region to ensure the light transmittance of the photosensitive region. On the basis of the opaque light-emitting unit, the photosensitive region can be disposed between the light-emitting units, i.e., the shape of the light-emitting unit need to be appropriately modified and the size of the light-emitting unit need to be appropriately reduced.

The display module provided in the embodiment of the present disclosure includes the first display region and the second display region. The first display region includes the plurality of first pixel circuit regions arranged in the array, and the second display region includes the plurality of second pixel circuit regions arranged in the array. On the basis of ensuring that the number of first pixel circuit regions per unit area is the same as the number of second pixel circuit regions per unit area, the first display region further includes the plurality of photosensitive regions. The display module further includes the image acquisition module, which includes the micro-lens module. The plurality of micro-lenses in the micro-lens module are in one-to-one correspondence with the plurality of photosensitive regions, and each of the plurality of micro-lenses is disposed in a respective one of the plurality of photosensitive regions. The first display region and the second display region can display normally, and the photosensitive regions in the first display region can acquire image elements. In this manner, a complete image can be acquired, a camera function is achieved, the problem that the hole region of the display panel does not have the display function is solved, the normal display of the image acquisition region is achieved, the integrity of the display image of the display module is ensured, the screen-to-body ratio is increased, and the full screen is achieved.

The above is a core concept of the present disclosure, technical solutions in the embodiments of the present disclosure will be described clearly and completely in conjunction with drawings in the embodiments of the present disclosure. Based on the embodiments of the present disclosure, all other embodiments obtained by those skilled in the art without creative work are within the scope of the present disclosure.

As mentioned above, the area of the first pixel circuit region and the area of the second pixel circuit region may be the same or different. Based on this, the embodiment of the present disclosure provides two display modules, which will be described below through specific embodiments.

Figure 1:
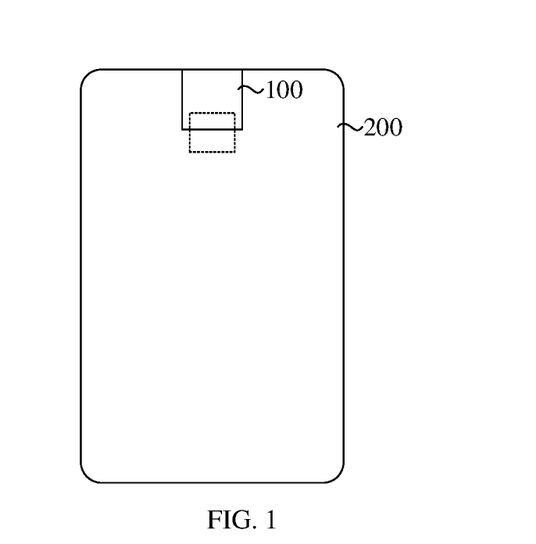
FIG. 1 is a structural diagram of a display module according to an embodiment of the present disclosure.
Figure 2:
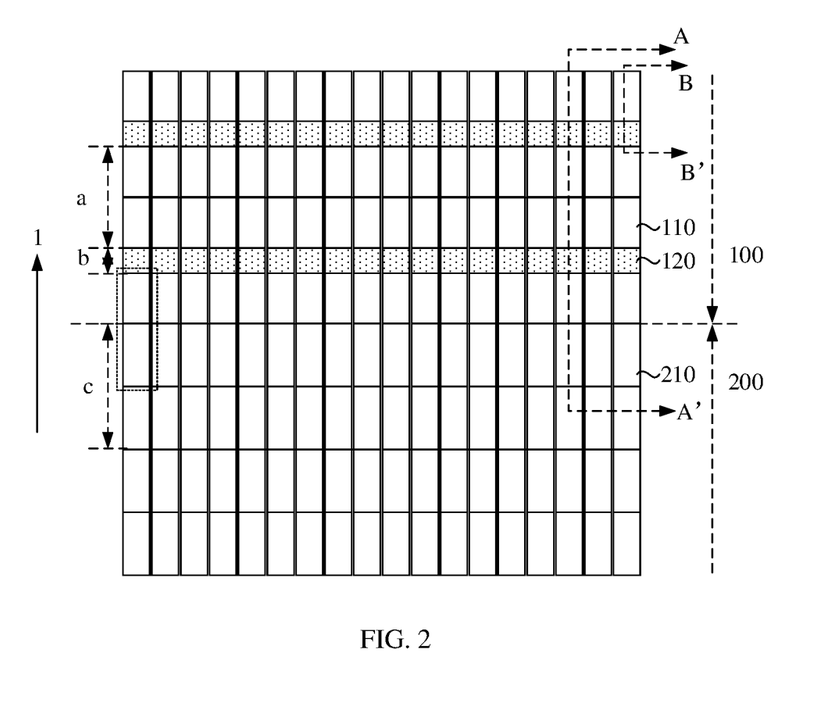
FIG. 2 is an enlarged diagram of a dashed box of the display module shown in FIG. 1.

First, the embodiment of the present disclosure provides multiple types of display modules for a scheme in which the sizes of the first pixel circuit region and the second pixel circuit region are inconsistent. FIG. 1 is a structural diagram of a display module according to an embodiment of the present disclosure, and FIG. 2 is an enlarged diagram of a dashed box of the display module shown in FIG. 1. Referring to FIGS. 1 and 2, a display module includes a first display region 100 and a second display region 200 bordering the first display region 100. The first display region 100 includes a plurality of first pixel circuit regions 110 arranged in an array, the second display region 200 includes a plurality of second pixel circuit regions 210 arranged in an array, and the first display region 100 further includes a plurality of photosensitive regions 120. The number of first pixel circuit regions 110 per unit area is the same as the number of second pixel circuit regions 210 per unit area.

The first display region 100 and the second display region 200 are provided with the first pixel circuit region 110 and the second pixel circuit region 210, respectively. Differences between the first pixel circuit region 110 and the second pixel circuit region 210 merely lie in the position, area and size. The similarity between the first pixel circuit region 110 and the second pixel circuit region 210 is that both the first pixel circuit region 110 and the second pixel circuit region 210 are provided with a pixel driving circuit. The pixel driving circuit can be used for driving a light-emitting unit corresponding to the pixel driving circuit to display. The first display region 100 may be set in a rectangular shape, a circular shape or the like, and its size and position are not limited in the present disclosure. The first display region 100 is provided with the plurality of photosensitive regions 120, which are essentially regions formed in the first display region 100 for transmitting external light. In a row direction of an organic light-emitting display module, adjacent three pixel circuit regions correspond to three organic light-emitting units emitting different color lights, respectively. Taking three primary colors of red, green and blue as an example, the pixel driving circuits disposed in the adjacent three pixel circuit regions are configured to drive the three organic light-emitting units to emit red light, green light and blue light, respectively, and each pixel unit can achieve full color display through the red organic light-emitting unit, the green organic light-emitting unit and the blue organic light-emitting unit, and thus the image display is performed.

Figure 3:
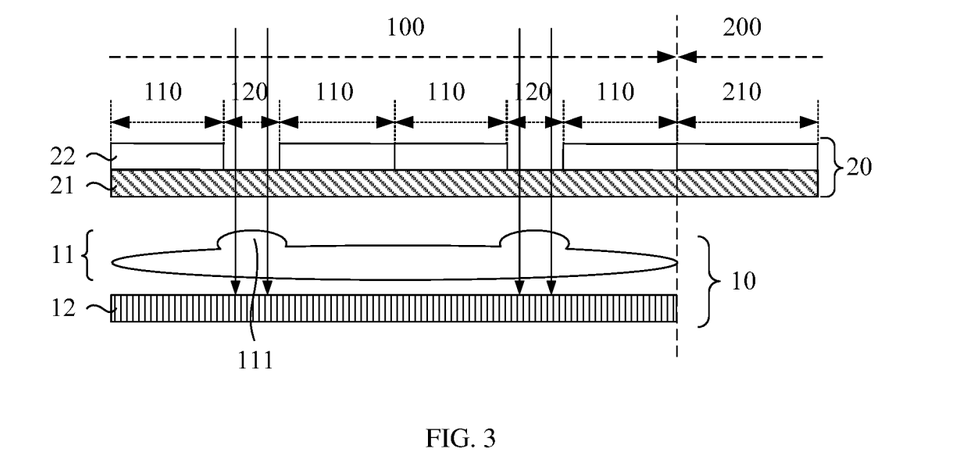
FIG. 3 is a cross-sectional view a display module taken along a line AA' shown in FIG. 2.

FIG. 3 is a cross-sectional view of the display module taken along a line AA' shown in FIG. 2. Referring to FIGS. 2 and 3, the display module further includes an image acquisition module 10, and the image acquisition module 10 includes a micro-lens module 11. The micro-lens module 11 includes a plurality of micro-lenses 111 which are in one-to-one correspondence with the plurality of photosensitive regions 120, and each of the plurality of micro-lenses 111 is disposed in a respective one of the plurality of photosensitive regions 120.

Specifically, still referring to FIG. 3, the display module further includes an array substrate 20. The array substrate 20 includes a base substrate 21 and a plurality of pixel driving circuits 22 disposed on the base substrate 21. The number of the plurality of pixel driving circuits 22 is the same as the total number of the plurality of first pixel circuit regions 110 and the plurality of second pixel circuit regions 210, that is, each pixel driving circuit 22 corresponds to a respective one of the plurality of first pixel circuit regions 110 and the plurality of second pixel circuit regions 210. The image acquisition module 10 is disposed on one side of the base substrate 21 facing away from the pixel driving circuits 22. The image acquisition module 10 includes a micro-lens module 11 and a photosensitive module 12, and the photosensitive module 12 performs image stitching according to the images acquired by the micro-lenses 111 in the micro-lens module 11.

In addition to the micro-lens module 11 which includes multiple micro-lenses 111 for enlarging the image elements, the image acquisition module 10 further includes the photosensitive module 12. The photosensitive module 12 is used for collecting the image elements enlarged by the micro-lenses 11. In a case where each image element is collected, the complete image acquisition can be achieved through an image stitching algorithm, and thus a function of image acquisition is achieved. As shown in the figure, the photosensitive module 12 may be one photosensitive module having a size approximately that of the first display region, or may include a plurality of photosensitive sub-modules disposed in one-to-one correspondence with the plurality of micro-lenses 11. Here, in order to ensure that the image acquisition module 10 performs effective image acquisition and image stitching, the area of the photosensitive region can be reasonably set according to the pixel size of the display panel. Optionally, the size of the photosensitive region 120 may be set to be greater than or equal to 10 μm×10 μm. In this case, the size of the photosensitive region 120 is approximately the same as the size of the pixel circuit region, so that each photosensitive region 120 can acquire an image element having a size approximately that of the pixel circuit region, and thus achieving pixel-level image stitching, and ensuring the integrity and clarity of image acquisition.

It is to be noted that setting the image acquisition module 10 on one side of the base substrate 21 facing away from the pixel drive circuit 22 is merely an example in the present disclosure. Those skilled in the art can set at least part of the image acquisition module 10 on the side of the array substrate 21 where the pixel drive circuit 22 is located according to the actual situation. The position of the image acquisition module 10 is not limited in the present disclosure.

In one or more embodiments, in a first direction 1, any two adjacent photosensitive regions 120 are spaced apart by a same number of first pixel circuit regions 110, and in the first direction 1, a sum of a total length of the first pixel circuit regions 110 between adjacent two photosensitive regions 120 and a length of one photosensitive region 120 is equal to a total length of second pixel circuit regions 210 with the same quantity as the first pixel circuit regions 110 between adjacent two photosensitive regions 120, where the first direction 1 is a row direction or a column direction of the display module.

For example, the embodiment shown in FIG. 2, the first direction 1 is the column direction. In the column direction, the first pixel circuit regions 110 located in the same column can be longitudinally compressed, that is, the length of the first pixel circuit region 110 in the longitudinal direction is shortened, and thus space can be saved to set the photosensitive regions 120 through compressing the certain number of first pixel circuit regions 110. In this case, the certain number of compressed first pixel circuit regions 110 are between adjacent two photosensitive regions 120. As shown in FIG. 2, one photosensitive region 120 can be disposed between two first pixel circuit regions 110 through reducing the length of the two first pixel circuit regions 110. The sum of the length a of the two first pixel circuit regions 110 and the length b of the photosensitive region 120 is equal to the length c of the second pixel circuit region 210. In other words, although the length of the first pixel circuit region 110 is reduced, the number of the first pixel circuit regions is not reduced, and it is ensured that the number of the first pixel circuit regions 110 per unit area is the same as the number of the second pixel circuit regions 210 per unit area, and this is, the setting density of the first pixel circuit regions 110 is the same as that of the second pixel circuit regions 210 in the second display region 200, and thus the pixel density of the first display region and the pixel density of the second display region are consistent, and the first display region and the second display region have a same display resolution.

Figure 4:
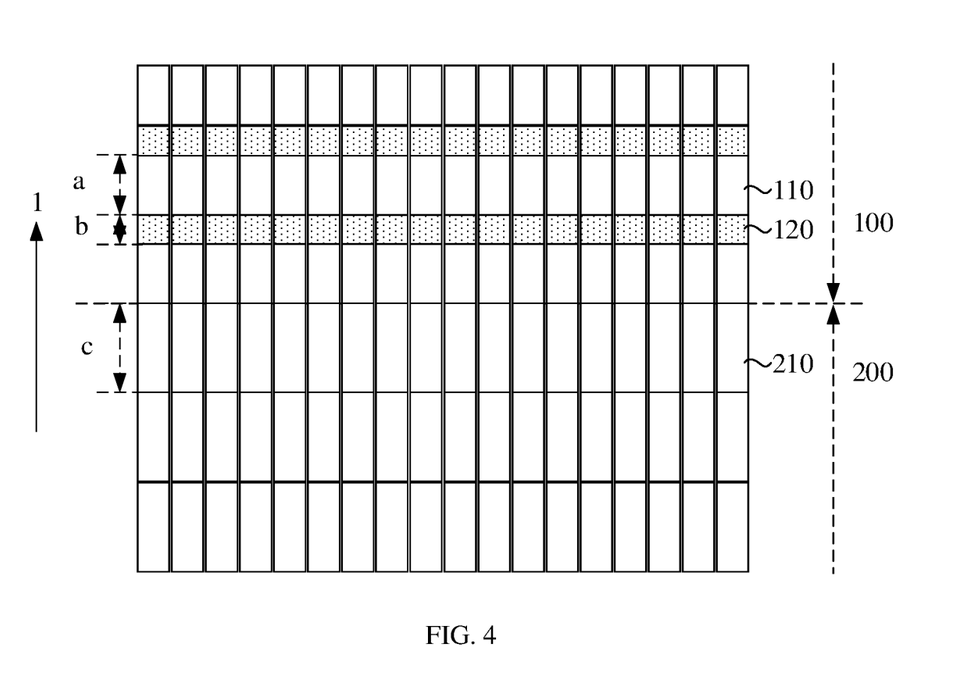
FIG. 4 is a partial enlarged diagram of another display module according to an embodiment of the present disclosure.

In one or more embodiments, as shown in FIG. 2, one photosensitive region 120 is disposed between two first pixel circuit regions 110 through reducing the length of two first pixel circuit regions 110, that is, any two adjacent photosensitive regions 120 are spaced apart by two first pixel circuit regions 110. In addition, any two adjacent photosensitive regions are provided with one first pixel circuit region disposed therebetween. FIG. 4 is a partial enlarged diagram of another display module according to an embodiment of the present disclosure. Referring to FIG. 4, in the display module, in the first direction 1, any two adjacent photosensitive regions 120 are provided with one first pixel driving circuit 110 that is disposed between the two adjacent photosensitive regions 120. In this case, each first pixel circuit region 110 is accompanied with one photosensitive region 120 by reducing the length of the first pixel circuit region 110. In the display module shown in FIGS. 2 and 4, each or two of the first pixel circuit regions are provided with one photosensitive region 120 by reducing the length of the first pixel circuit region, and the number of photosensitive regions 120 in the first display region can be ensured, thus improving the density of image element acquisition, being beneficial to improving the imaging quality of the image and ensuring the clarity of the image.

It is to be noted that in the first display region of the display module shown in FIGS. 2 and 4, the first pixel circuit regions in each column are compressed to save space for setting the photosensitive regions 120. Certainly, as long as the density of the photosensitive region satisfies the requirement, only the first pixel circuit regions in particular columns are compressed according to actual needs. For example, every certain number of first pixel circuit region columns includes one column in which the first pixel circuit regions are compressed in the column direction, and the photosensitive region is set, such that the area of the light-emitting unit is ensured and the difference between the display effect of the first display region and the display effect of the second display region is not too large.

Figure 5:
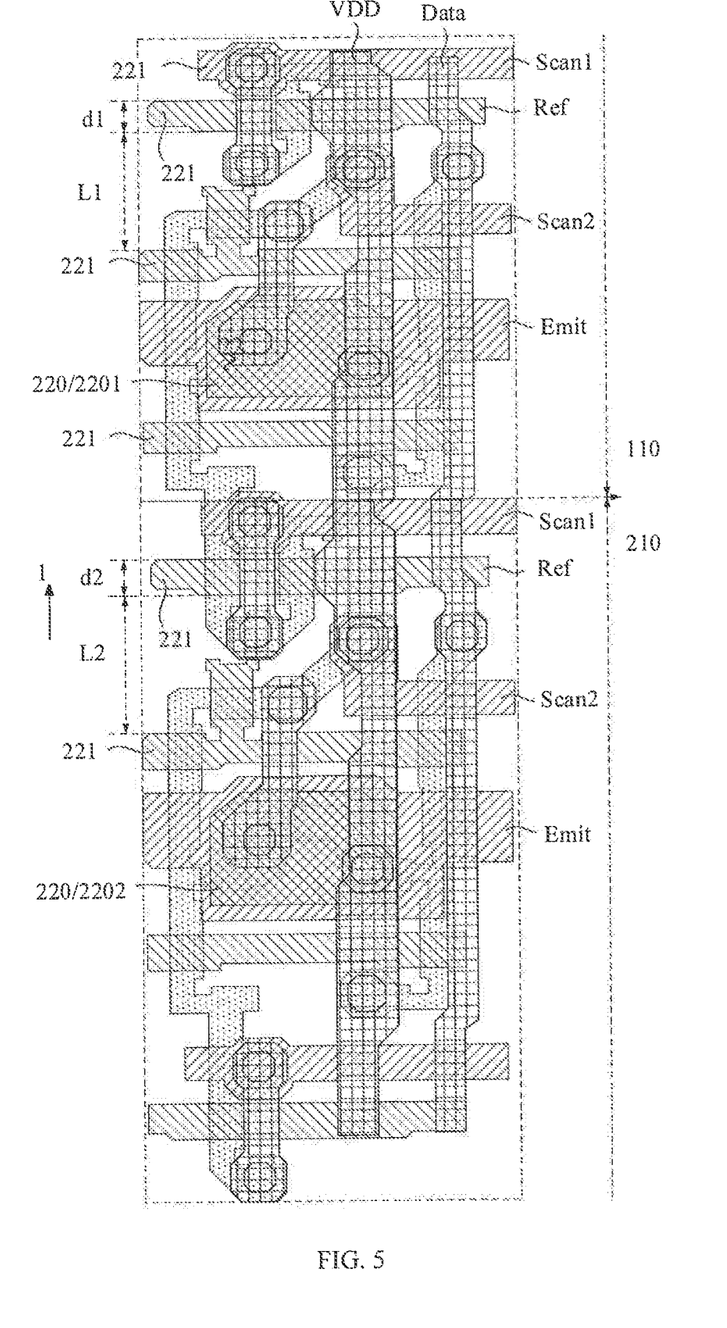
FIG. 5 is a partial enlarged diagram of the display module shown in FIG. 2 at a dashed box.

An implementation of the display module provided in the above embodiment will be described below. Specifically, FIG. 5 is an enlarged diagram of a dashed box of the display module shown in FIG. 2. Referring to FIG. 5, each of the first pixel circuit region 110 and the second pixel circuit region 210 includes a pixel driving circuit 22, and the pixel driving circuit 22 includes a storage capacitance electrode 220 and a plurality of first wires 221 extending along a direction perpendicular to the first direction 1.

In the first direction 1, the storage capacitance electrode 220 in the first pixel circuit region 110 is a first storage capacitance electrode 2201, the storage capacitance electrode 220 in the second pixel circuit region 210 is a second storage capacitance electrode 2202, and an area of the first storage capacitance electrode 2201 is less than an area of the second storage capacitance electrode 2202; and/or, a line width d1 of the first wire 221 in the first pixel circuit region 110 is smaller than a line width d2 of the first wire 221 in the second pixel circuit region 210; and/or, a pitch L1 between the first wires 221 in the first pixel circuit region 110 is smaller than a pitch L2 between the first wires 221 in the second pixel circuit region 210.

The size reduction of the first pixel circuit region 110 in the first direction 1 is implemented by scaling down wires or components in the pixel driving circuit 22 in the first direction 1. As shown in FIG. 5, in the pixel driving circuit 22 of the second pixel circuit region 210, a component having a longer length in the first direction 1 may be a storage capacitor, and accordingly, in the first display region 100, the size of the electrode of the storage capacitor in the pixel driving circuit 22 can be reduced, i.e., the area of the first storage capacitance electrode 2201 is smaller than the area of the second storage capacitance electrode 2202. Moreover, in order to further reduce the length of the first pixel circuit region 110 in the first direction 1, the line width and pitch of the wire extending along a direction perpendicular to the first direction 1 may also be reduced. In an example where the first direction 1 is the column direction, in the pixel driving circuit 22, the wires extending along a direction perpendicular to the first direction 1, i.e., extending along the row direction, include a reference voltage line Ref, a scanning line Scan, and a light-emitting control signal line Emit. When the pixel driving circuit of the first display region 100 is designed, the line widths or pitches of these signal lines can be reduced to save space for setting the photosensitive region. In one or more embodiments, in the display module shown in FIG. 5, the area of the first storage capacitance electrode 2201 is set to be smaller than the area of the second storage capacitance electrode 2202, and the line width d1 and the pitch L1 of the first wire 221 in the first pixel circuit region 110 are smaller than the line width d2 and the pitch L2 of the first wire 221 in the second pixel circuit region 210, respectively, thereby ensuring the maximum reduction of the first pixel circuit region 110 in the first direction 1, increasing the number and density of the photosensitive regions 120, improving the image acquisition capability of the photosensitive regions 120, and improving the imaging quality.

Figure 6:
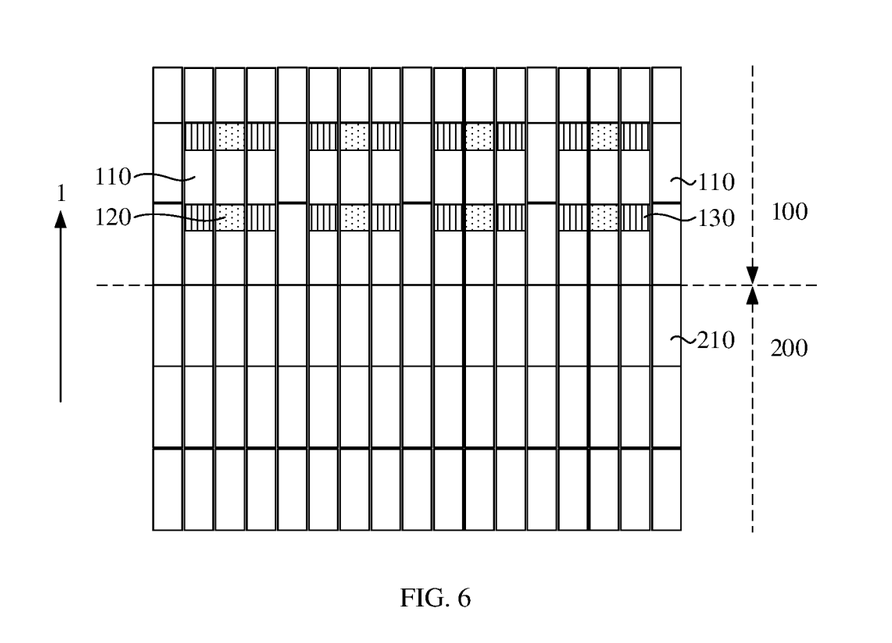
FIG. 6 is a partial enlarged diagram of yet another display module according to an embodiment of the present disclosure.

FIG. 6 is a partial enlarged diagram of yet another display module according to an embodiment of the present disclosure. Referring to FIG. 6, the first direction 1 is the column direction, in the display module, the first display region 100 further includes a plurality of wire setting regions 130. In the first direction 1, any two adjacent wire setting regions 130 are spaced apart by the same number of first pixel circuit regions 110. The wire setting region 130 and the photosensitive region 120 are adjacent in a direction perpendicular to the first direction 1. The pixel driving circuit 22 further includes a plurality of second wires (not shown in FIG. 6)

extending along the first direction 1. In the first direction 1, the second wires in two first pixel driving circuits 110 adjacent to the photosensitive region 120 extend into the wire setting regions 130 adjacent to the photosensitive region 120.

The wire setting region 130 occupies a certain area of the display region and is mainly used for wire layout. As shown in FIG. 6, in two first pixel circuit regions 110 adjacent to the photosensitive region 120 in the column direction, the wires extending along the column direction need to be connected. On the basis of setting the photosensitive region 120, the wires extending along a longitudinally direction, that is, the second wires, are wound to increase the area of the photosensitive region 120, such that the area of the image element collected by corresponding position of each photosensitive region 120 can be increased, and thus distortion caused by too small area of the image element can be avoided, and the clarity of the stitched image can be improved. The wire setting region 130 is adjacent to the photosensitive region 120. In order to achieve a reasonable layout of multiple second wires in the pixel driving circuit 22, each photosensitive region 120 is provided with two wire setting regions 130 disposed on two sides of the photosensitive region 120 perpendicular to the first direction 1.

Figure 7:
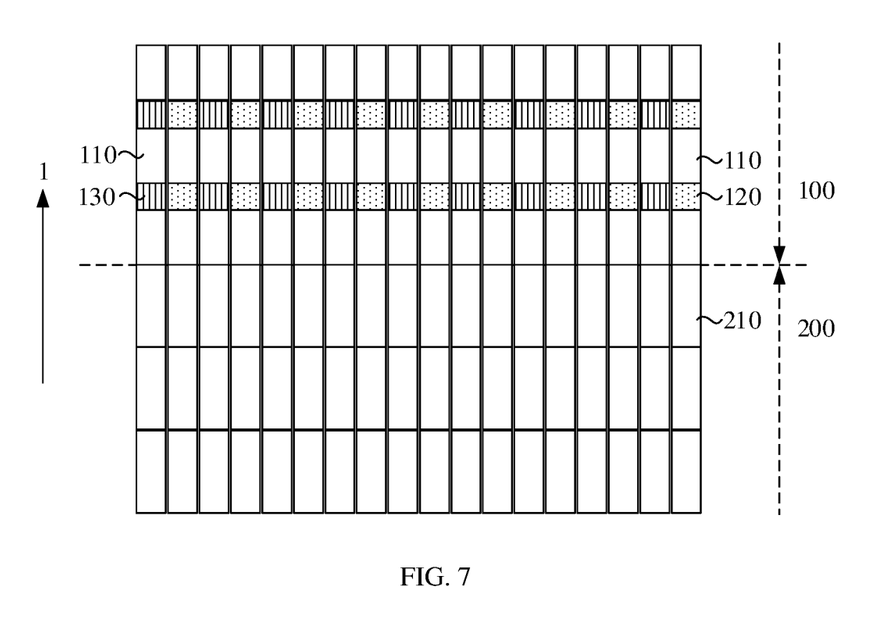
FIG. 7 is a partial enlarged diagram of yet another display module according to an embodiment of the present disclosure.

On the basis of setting the photosensitive region and the wire setting region, the density of the photosensitive regions can be reasonably changed in the display region. FIG. 7 is a partial enlarged diagram of yet another display module according to an embodiment of the present disclosure. Referring to FIG. 7, the photosensitive regions 120 are disposed alternately with the wire setting regions 130 in the direction perpendicular to the first direction 1. In this case, each photosensitive region 120 is adjacent to two wire setting regions 130 in the row direction, and multiple wires extending along the longitudinally direction and located in the same column with the photosensitive regions 120 can be divided into two groups each extending into a respective one of the two wire setting regions 130, such that the photosensitive region 120 has a larger area and the photosensitive region has a circular shape, and thereby forming regular image elements, and facilitating subsequent image element stitching.

Figure 8:
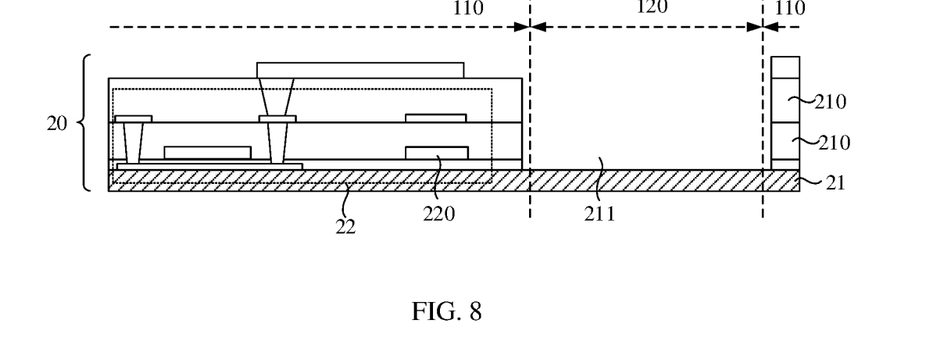
FIG. 8 is a partial cross-sectional view along BB' of a display module shown in FIG. 2.

FIG. 8 is a partial cross-sectional view of a display module taken along a line BB' shown in FIG. 2. Referring to FIG. 8, the display module includes an array substrate 20. The array substrate 20 includes a base substrate 21 and a plurality of pixel driving circuits 22 disposed on the base substrate 21. The plurality of pixel driving circuits 22 are in one-to-one correspondence with the plurality of first pixel circuit regions and the plurality of second pixel circuit regions (not shown in figure). The pixel driving circuit 22 includes a storage capacitance electrode 220, a plurality of first wires extending along a direction perpendicular to the first direction and a plurality of second wires (not shown) extending along the first direction. The array substrate 21 is further provided with a plurality of insulating films 210, which are used for isolating the storage capacitance electrodes, the plurality of first wires and the plurality of second wires. Each insulating film 210 is provided with a first via 211, and the photosensitive region 120 is located in an orthographic projection of the first via 211 on the base substrate 21.

In general, the insulating film 210 is made of a transparent organic material or transparent inorganic material, and is used for insulating each wire and each component electrode in the pixel drive circuit. The insulating film 210 has a certain transmittance coefficient, that is, has a certain blocking effect to external light. By setting the first via 211 and setting the photosensitive region 120 in the orthographic projection of the first via 211 on the base substrate 21, the array substrate 20 does not block the light to the photosensitive region 120, such that the amount of the light received by the photosensitive region 120 is increased, and the image acquisition module 10 can acquire external light through the photosensitive region 120 more effectively, and thereby acquiring clear image elements and improving imaging quality.

Figure 9:
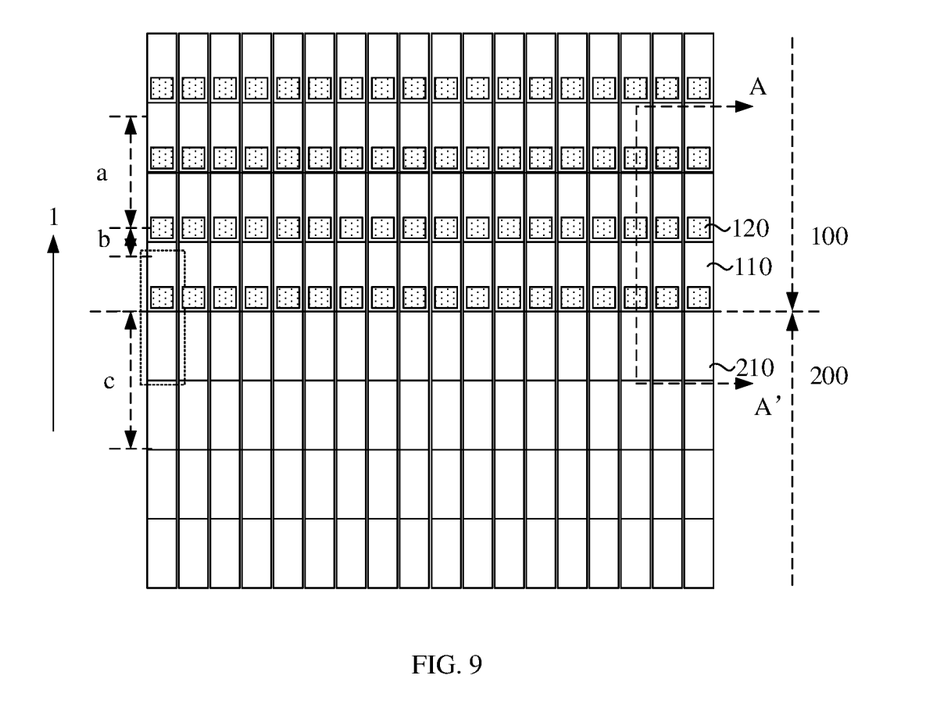
FIG. 9 is a structural diagram of yet another display module according to an embodiment of the present disclosure.

The embodiment of the present disclosure provides multiple types of display modules for a scheme in which the area of the first pixel circuit region and the area of the second pixel circuit region are the same. FIG. 9 is a structural diagram of yet another display module according to an embodiment of the present disclosure. Referring to FIG. 9, the display module includes a first display region 100 and a second display region 200 bordering the first display region 100. The first display region 100 includes a plurality of first pixel circuit regions 110 arranged in an array, the second display region 200 includes a plurality of second pixel circuit regions 210 arranged in an array, and the first display region 100 further includes a plurality of photosensitive regions 120. The number of first pixel circuit regions 110 per unit is the same as the number of second pixel circuit regions 210 per unit area. The first display region 100 includes a plurality of first pixel circuit regions 110. The second display region 200 includes a plurality of second pixel circuit regions 210. Differences between the first pixel circuit region 110 and the second pixel circuit region 210 merely lie in the position, and the similarity between the first pixel circuit region 110 and the second pixel circuit region 210 is that the area of the first pixel circuit region 110 and the area of the second pixel circuit region 210 are the same. Each of the first pixel circuit region 110 and the second pixel circuit region 210 includes a pixel driving circuit, which is used for driving a light-emitting-unit corresponding to the pixel driving circuit to display. Similarly, the first display region 100 is provided with photosensitive regions 120, which are essentially regions formed in the first display region 100 for transmitting external light. In a row direction of an organic light-emitting display module, adjacent three pixel circuit regions correspond to three organic light-emitting units emitting different color lights, respectively. For example, three primary colors include red, green and blue, the pixel driving circuits disposed in the adjacent three pixel circuit regions are configured to drive a red organic light-emitting unit, a green organic light-emitting unit and a blue organic light-emitting unit respectively. Each pixel unit can achieve full color display through the red organic light-emitting unit, the green organic light-emitting unit and the blue organic light-emitting unit, and thus the image display is performed.

Figure 10:
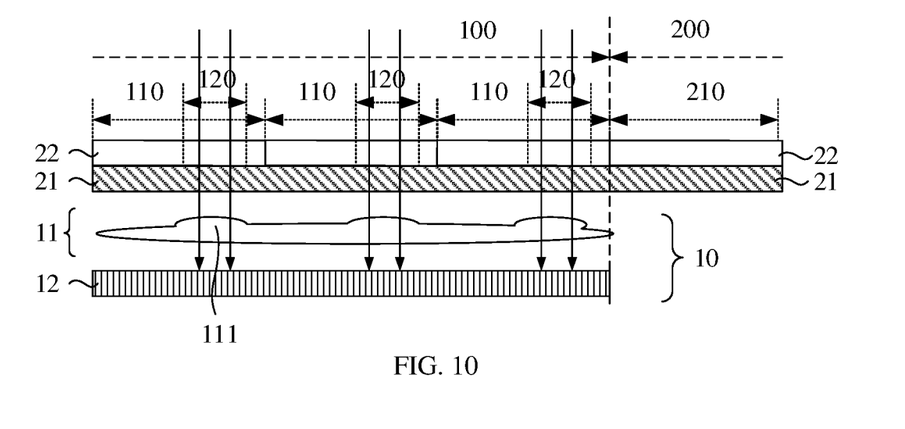
FIG. 10 is a cross-sectional view of a display module shown in FIG. 9.

FIG. 10 is a cross-sectional view of the display module shown in FIG. 9. Referring to FIGS. 9 and 10, the display module further includes an image acquisition module 10, which includes a micro-lens module 11. The micro-lens module 11 includes a plurality of micro-lenses 111 which are in one-to-one correspondence with the plurality of photosensitive regions 120, and each of the plurality of micro-lenses 111 is disposed in a respective one of the plurality of photosensitive regions 120.

Similarly, still referring to FIG. 10, the display module further includes an array substrate 20. The array substrate 20 includes a base substrate 21 and a plurality of pixel driving circuits 22 disposed on the base substrate 21. The plurality of pixel driving circuits 22 are in one-to-one correspondence with the plurality of first pixel circuit regions 110 and the plurality of second pixel circuit regions 210. The image acquisition module 10 is disposed on one side of the base substrate 21 facing away from the pixel driving circuits 22. The image acquisition module 10 includes the micro-lens module 11 and a photosensitive module 12, and the photosensitive module 12 performs image stitching according to the images acquired by the micro-lenses 111 in the micro-lens module 11.

In one or more embodiments, the area of the first pixel circuit region 110 is equal to the area of the second pixel circuit region 210, and the photosensitive region 120 is located in the first pixel circuit region 110. In this case, the layout of the wires or components in the pixel drive circuit 22 is reasonably designed or the wires or the components are made of transparent material, such that the photosensitive region 120 can be disposed in the first pixel circuit region 110. Those skilled in the art can reasonably set the size and shape of the photosensitive region 120 according to the area and layout of the actual pixel circuit region. In one or more embodiments, the size of the photosensitive region 120 can be set to be greater than or equal to 10 μm×10 μm, and accordingly, the photosensitive region 120 has a sufficient area to collect a clear image element, and thus the imaging quality of the display module can be ensured.

Figure 11:
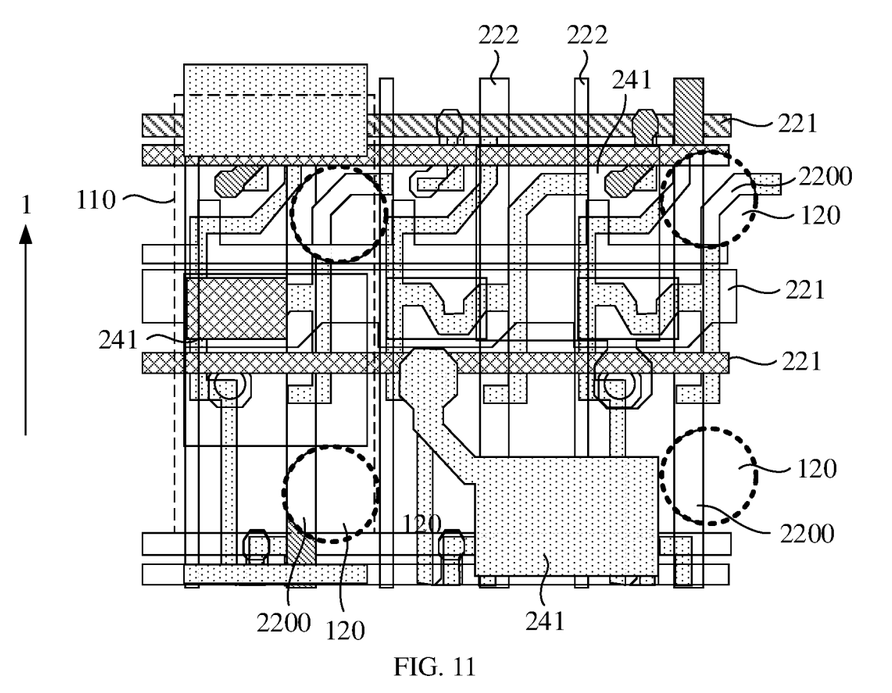
FIG. 11 is a structural diagram of yet another display module according to an embodiment of the present disclosure.

FIG. 11 is a structural diagram of yet another display module according to an embodiment of the present disclosure. A display module in which a first pixel circuit region and a second pixel circuit region have the same area will be described below with an example of the display module in FIG. 11. The first pixel circuit region 110 includes a pixel driving circuit, and the pixel driving circuit includes a plurality of first wires 221 extending along a direction perpendicular to a first direction 1 and a plurality of second wires 222 extending along the first direction 1. The first wire 221 and the second wire 222 passing through the photosensitive region 120 are transparent conductive wires 2200.

The transparent conductive wire 2200 may be made of transparent metal oxides, such as indium tin oxide, indium gallium zinc oxide, etc. The wires passing through the photosensitive region 120 are transparent conductive wires, so a light-transmitting photosensitive region can be formed in the pixel circuit region. It is to be noted that the first wires 221 and the second wires 222 passing through the photosensitive regions 120 may be all made of transparent metal oxide, alternatively, merely wire segments in the photosensitive regions 120 are made of transparent metal oxides. Those skilled in the art can make reasonable design according to characteristics of actual conductive wire material such as resistivity or conductivity, and are not repeated herein. In addition, as shown in FIG. 11, in a case where the photosensitive region 120 is set, it is necessary to reasonably set the position of the photosensitive region 120. On the one hand, it is necessary to ensure that whether the first wires and the second wires passing through the photosensitive regions 120 may be set as the transparent conductive wires and reasonability of setting as transparent conductive wires; on the other hand, it is also necessary to ensure that whether the area of the photosensitive region satisfies acquisition requirements of the image elements when the first wires and the second wires are set as the transparent conductive wires to form transparent photosensitive regions 120.

Figure 12:
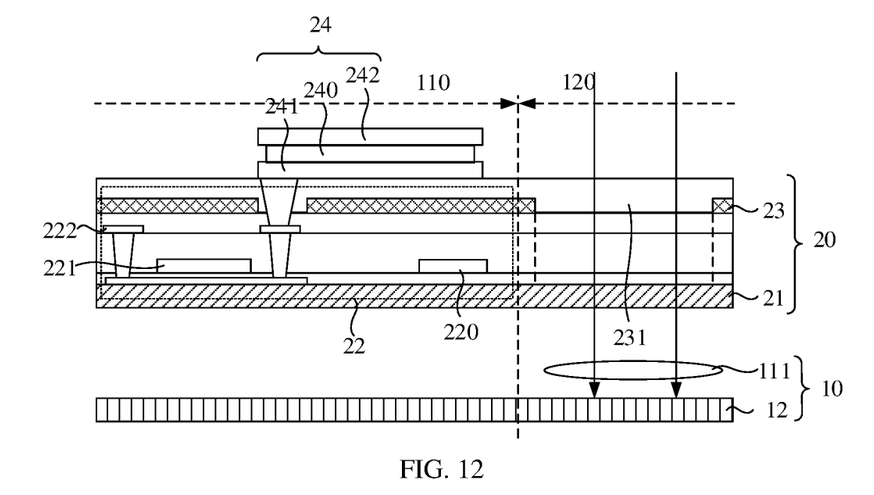
FIG. 12 is a cross-sectional view of yet another display module according to an embodiment of the present disclosure.

The embodiment of the present disclosure further provides a display module based on the embodiment described above. FIG. 12 is a cross-sectional view of yet another display module according to an embodiment of the present disclosure. Referring to FIG. 12, the display module includes an array substrate 20. The array substrate 20 includes a base substrate 21 and a plurality of pixel driving circuits 22 disposed on the base substrate 21. The plurality of pixel driving circuits 22 are in one-to-one correspondence with the plurality of first pixel circuit regions and the plurality of second pixel circuit regions (not shown). The array substrate further includes a light-shielding portion 23. An orthographic projection of the light-shielding portion 23 on the base substrate 21 is located at least in the first display region. The light-shielding portion 23 is provided with a plurality of second vias 231. An orthographic projection of each of the plurality of second vias 231 on the base substrate 21 is located in one of the plurality of photosensitive regions 120, and an orthographic projection of each of the plurality of micro-lenses 111 on a plane where the light-shielding portion 23 is located is located in a respective one of the plurality of second vias 231. The orthographic projection of the light-shielding portion 23 on the base substrate 21 at least covers an orthographic projection of wires at the edge of the photosensitive region 120 on the base substrate 21.

The orthographic projection of each of the plurality of micro-lenses 111 on a plane where the light-shielding portion 23 is located is in a respective one of the plurality of second vias 231, and the micro-lens 111 acquires external light through the second via 231, and thus the image elements of an external image are collected. The orthographic projection of each of the plurality of second vias 231 of the light-shielding portion 23 on the base substrate 21 is located in a respective one of the plurality of photosensitive regions 120, and light at the edge of the photosensitive region 120 may be shielded by the light-shielding portion 23. In particular, in a case where wires exist at the edge of the photosensitive region 120, there are gaps between the wires. In a case where the external light passes through the gaps, light diffraction easily occurs, and the image element collected by the micro-lens is not clear. By setting the light-shielding portion 23, the orthographic projection of the light-shielding portion 23 on the substrate 21 at least covers projection of the wires at the edge of the photosensitive region 120 on the substrate 21. It can be ensured that the light-shielding portion 23 shields the wires at the edge of the photosensitive region 120, and the external light is prevented from entering gaps between the wires and a diffraction phenomenon is prevented, so that the clarity of the image elements collected by the micro-lenses can be ensured and improved, and the imaging quality of the image acquisition module can be improved.

As shown in FIG. 12, the pixel driving circuit 22 includes a plurality of first wires 221 extending along a row direction and a plurality of second wires 222 extending along a column direction. Each first pixel circuit region 110 is correspondingly provided with an organic light-emitting unit 24, and the organic light-emitting unit 24 includes a first electrode 241, an organic light-emitting function layer 240 and a second electrode 242 sequentially stacked along a light emitting direction.

A film where the second wires 222 are located is located between a film where the first wires 221 are located and a film where the first electrode 241 is located, and the light-shielding portion 23 is located between the film where the second wires 222 are located and the film where the first electrode 241 is located.

Figure 13:
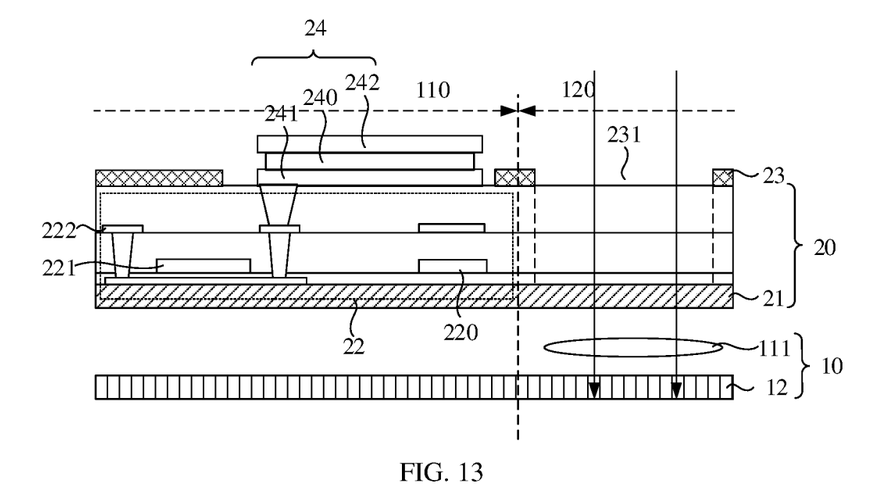
FIG. 13 is a cross-sectional view of yet another display module according to an embodiment of the present disclosure.

In addition, the embodiment of the present disclosure further provides a display module for the specific setting position of the light-shielding portion. FIG. 13 is a cross-sectional view of yet another display module according to an embodiment of the present disclosure. Referring to FIG. 13, the pixel driving circuit 22 includes a plurality of first wires 221 extending along a row direction and a plurality of second wires 222 extending along a column direction. Each first pixel circuit region 110 includes an organic light-emitting unit 24, and the organic light-emitting unit 24 includes a first electrode 241, an organic light-emitting function layer 240 and a second electrode 242 sequentially stacked along a light emitting direction. A film where the plurality of second wires 222 is located between a film where the plurality of first wires 221 is located and a film where the first electrode 241 is located. The light-shielding portion 23 and the first electrode 241 are disposed in a same layer. By setting the light-shielding portion 23 and the first electrode 241 in the same layer, the light-shielding portion 23 and the first electrode 241 can be formed in a same process. In one or more embodiments, the first electrode 241 is made of an opaque metal material. Compared with the conventional forming process of the first electrode 241, in the process of simultaneously forming the first electrode 241 and the light-shielding portion 23, merely one mask pattern is used in the deposition process, so that the steps and difficulty of the forming process can be reduced. Furthermore, the light-shielding portion 23 and the first electrode 241 are in the same layer, the number of layers of the array substrate is reduced, thereby helping to reduce the thickness of the array substrate.

Figure 14:
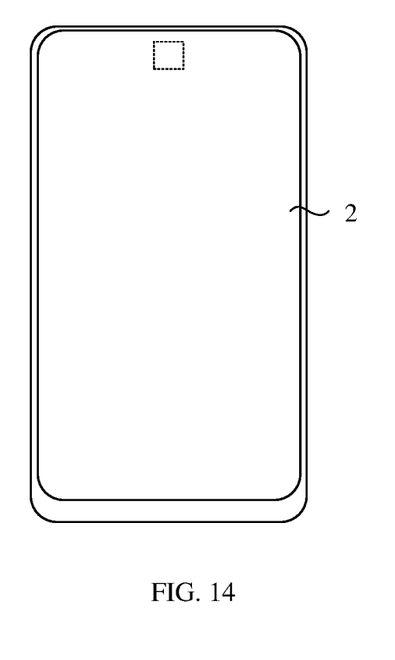
FIG. 14 is a structural view of a display apparatus according to an embodiment of the present disclosure.

FIG. 14 is a structural diagram of a display apparatus according to an embodiment of the present disclosure. Referring to FIG. 14, a display apparatus includes any display module 2 provided in the embodiment of the present disclosure. The display apparatus may specifically be a mobile phone, an intelligent plate, a computer, a smart wearable apparatus and the like.

It is to be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the preceding embodiments, the present disclosure is not limited to the preceding embodiments and may further include more other equivalent embodiments without departing from the concept of the present disclosure. The scope of the present disclosure is determined by the scope of the appended claims.

What is claimed is:

1. A display module, comprising: a first display region and a second display region bordering the first display region;
wherein the first display region comprises a plurality of first pixel circuit regions arranged in an array, the second display region comprises a plurality of second pixel circuit regions arranged in an array, and the first display region further comprises a plurality of photosensitive regions, wherein a number of the first pixel circuit regions per unit area and a number of the second pixel circuit regions per unit area are the same; and
wherein the display module further comprises an image acquisition module, the image acquisition module comprises a micro-lens module, the micro-lens module comprises a plurality of micro-lenses in one-to-one correspondence with the plurality of photosensitive regions, and each of the plurality of micro-lenses is disposed in a respective one of the plurality of photosensitive regions;
wherein the first display region further comprises a plurality of wire setting regions, wherein in a first direction, any adjacent two of the plurality of wire setting regions are spaced apart by a same number of first pixel circuit regions, and each of the plurality of wire setting regions is adjacent to a respective one of the plurality of photosensitive regions in a second direction perpendicular to the first direction; wherein the first direction is a row direction or a column direction of the display module;
wherein each of the plurality of first pixel circuit regions and the plurality of second pixel circuit regions is provided with a pixel driving circuit, the pixel driving circuit comprises a plurality of second wires extending along the first direction; and
wherein in the first direction, the plurality of second wires in two first pixel circuit regions adjacent to the photosensitive region extend into the wire setting regions adjacent to the photosensitive region.

2. The display module of claim 1, wherein in a first direction, any adjacent two of the plurality of photosensitive regions are spaced apart by a same number of first pixel circuit regions, and in the first direction, a sum of a total length of the first pixel circuit regions between adjacent two of the plurality of photosensitive regions and a length of one of the plurality of photosensitive regions is equal to a total length of the second pixel circuit regions a number of which is the same as the number of the first pixel circuit regions between two adjacent photosensitive regions.

3. The display module of claim 2, wherein any adjacent two of the plurality of photosensitive regions is spaced apart by one or two of the plurality of first pixel circuit regions.

4. The display module of claim 2, wherein the pixel driving circuit comprises a storage capacitance electrode and a plurality of first wires extending along the second direction perpendicular to the first direction; and
wherein in the first direction, the storage capacitance electrode in each of the plurality of first pixel circuit regions is a first storage capacitance electrode, and the storage capacitance electrode in each of the plurality of second pixel circuit regions is a second storage capacitance electrode, wherein an area of the first storage capacitance electrode is less than an area of the second storage capacitance electrode.

5. The display module of claim 2, wherein each of the plurality of first pixel circuit regions and the plurality of second pixel circuit regions is provided with a pixel driving circuit, and the pixel driving circuit comprises a storage capacitance electrode and a plurality of first wires extending along the second direction perpendicular to the first direction; and
wherein in the first direction, the storage capacitance electrode in each of the plurality of first pixel circuit regions is a first storage capacitance electrode, and the storage capacitance electrode in each of the plurality of second pixel circuit regions is a second storage capacitance electrode, wherein a line width of each of the plurality of first wires in the first pixel circuit region is smaller than a line width of each of the plurality of first wires in the second pixel circuit region.

6. The display module of claim 2, wherein each of the plurality of first pixel circuit regions and the plurality of second pixel circuit regions is provided with a pixel driving circuit, and the pixel driving circuit comprises a storage capacitance electrode and a plurality of first wires extending along the second direction perpendicular to the first direction; and
wherein in the first direction, the storage capacitance electrode in each of the plurality of first pixel circuit regions is a first storage capacitance electrode, and the storage capacitance electrode in each of the plurality of second pixel circuit regions is a second storage capacitance electrode, wherein a pitch between adjacent two of the plurality of first wires in the first pixel circuit region is smaller than a pitch between adjacent two of the plurality of first wires in the second pixel circuit region.

7. The display module of claim 4, wherein the plurality of photosensitive regions are disposed alternately with the plurality of wire setting regions in the direction perpendicular to the first direction.

8. The display module of claim 2, further comprising an array substrate, wherein the array substrate comprises a base substrate and a plurality of pixel driving circuits disposed on the base substrate, wherein the plurality of pixel driving circuits are in one-to-one correspondence with the plurality of first pixel circuit regions and the plurality of second pixel circuit regions, and each of the plurality of pixel driving circuits comprises a storage capacitance electrode, a plurality of first wires extending along the second direction perpendicular to the first direction and a plurality of second wires extending along the first direction; and the array substrate is further provided with a plurality of insulating films, wherein the plurality of insulating films are used for isolating the storage capacitance electrode, the plurality of first wires and the plurality of second wires; and
wherein each of the plurality of insulating films is provided with a first via, and the photosensitive region is located in an orthographic projection of the first via on the base substrate.

9. The display module of claim 1, wherein an area of the first pixel circuit region is equal to an area of the second pixel circuit region, and the photosensitive region is located in the first pixel circuit region.

10. The display module of claim 7, wherein each of the plurality of first pixel circuit regions is provided with a pixel driving circuit, and the pixel driving circuit comprises a plurality of first wires extending along the second direction perpendicular to a first direction and a plurality of second wires extending along the first direction; and
wherein the first wires and the second wires passing through the plurality of photosensitive regions are transparent conductive lines.

11. The display module of claim 1, wherein a size of each of the plurality of photosensitive regions is greater than or equal to 10 μm×10 μm.

12. The display module of claim 1, further comprising an array substrate, wherein the array substrate comprises a base substrate and a plurality of pixel driving circuits disposed on the base substrate, and each of the plurality of pixel driving circuits are in one-to-one correspondence with the plurality of first pixel circuit regions and the plurality of second pixel circuit regions; and
wherein the array substrate further comprises a light-shielding portion, wherein an orthographic projection of the light-shielding portion on the base substrate is located at least in the first display region, and the light-shielding portion is provided with a plurality of second vias, wherein an orthographic projection of the second via on the base substrate is located in the photosensitive region, and an orthographic projection of each of the plurality of micro-lenses on a plane where the light-shielding portion is located in a respective one of the plurality of second vias; and the orthographic projection of the light-shielding portion on the base substrate at least covers an orthographic projection of a wire at an edge of the photosensitive region on the base substrate.

13. The display module of claim 12, wherein each of the plurality of pixel driving circuits comprises a plurality of first wires extending along a row direction and a plurality of second wires extending along a column direction;
wherein each of the plurality of first pixel circuit regions is provided with an organic light-emitting unit, and the organic light-emitting unit comprises a first electrode, an organic light-emitting function layer and a second electrode sequentially stacked along a light emitting direction; and
wherein a film where the plurality of second wires is located between a film where the plurality of first wires are located and a film where the first electrode is located, and the light-shielding portion is located between the film where the plurality of second wires are located and the film where the first electrode is located.

14. The display module of claim 12, wherein each of the plurality of pixel driving circuits comprises a plurality of first wires extending along a row direction and a plurality of second wires extending along a column direction;
wherein each of the plurality of first pixel circuit regions is provided with an organic light-emitting unit, and the organic light-emitting unit comprises a first electrode, an organic light-emitting function layer and a second electrode sequentially stacked along a light emitting direction; and
wherein a film where the plurality of second wires is located between a film where the plurality of first wires are located and a film where the first electrode is located, and the light-shielding portion and the first electrode are disposed in a same layer.

15. The display module of claim 1, wherein in a row direction of the display module, adjacent three pixel circuit regions respectively correspond to three organic light-emitting units configured to emit different color lights.

16. The display module of claim 1, comprising an array substrate, wherein the array substrate comprises a base substrate and a plurality of pixel driving circuits disposed on the base substrate, and the plurality of pixel driving circuits are in one-to-one correspondence with the plurality of first pixel circuit regions and the plurality of second pixel circuit regions; and
wherein the image acquisition module is disposed on one side of the base substrate facing away from the plurality of pixel driving circuits, and the image acquisition module comprises the micro-lens module and a photosensitive module, wherein the photosensitive module performs image stitching according to images collected by the plurality of micro-lenses in the micro-lens module.

17. A display apparatus, comprising a display module, wherein the display module comprises: a first display region and a second display region bordering the first display region,
wherein the first display region comprises a plurality of first pixel circuit regions arranged in an array, the second display region comprises a plurality of second pixel circuit regions arranged in an array, and the first display region further comprises a plurality of photosensitive regions, wherein a number of the first pixel circuit regions per unit area and a number of the second pixel circuit regions per unit area are the same; and wherein the display module further comprises an image acquisition module, the image acquisition module comprises a micro-lens module, the micro-lens module comprises a plurality of micro-lenses in one-to-one correspondence with the plurality of photosensitive regions, and each of the plurality of micro-lenses is disposed in a respective one of the plurality of photosensitive regions;

wherein the first display region further comprises a plurality of wire setting regions, wherein in the first direction, any adjacent two of the plurality of wire setting regions are spaced apart by a same number of first pixel circuit regions, and each of the plurality of wire setting regions is adjacent to a respective one of the plurality of photosensitive regions in second direction perpendicular to the first direction; wherein the first direction is a row direction or a column direction of the display module;

wherein each of the plurality of first pixel circuit regions and the plurality of second pixel circuit regions is provided with a pixel driving circuit, the pixel driving circuit comprises a plurality of second wires extending along the first direction; and wherein in the first direction, the plurality of second wires in two first pixel circuit regions adjacent to the photosensitive region extend into the wire setting regions adjacent to the photosensitive region.

\* \* \* \* \*